United States Patent
Yin et al.

(10) Patent No.: US 10,968,529 B2
(45) Date of Patent: Apr. 6, 2021

(54) INSULATION SYSTEMS AND METHODS OF DEPOSITING INSULATION SYSTEMS

(71) Applicant: General Electric Company, Schenectady, NY (US)

(72) Inventors: Weijun Yin, Schenectady, NY (US); Anil Raj Duggal, Niskayuna, NY (US); Ravisekhar Nadimpalli Raju, Clifton Park, NY (US)

(73) Assignee: General Electric Company, Schenectady, NY (US)

( * ) Notice: Subject to any disclaimer, the term of this patent is extended or adjusted under 35 U.S.C. 154(b) by 18 days.

(21) Appl. No.: 16/402,929

(22) Filed: May 3, 2019

(65) Prior Publication Data
US 2020/0347509 A1 Nov. 5, 2020

(51) Int. Cl.
| | | |
|---|---|---|
| *C25D 13/12* | (2006.01) | |
| *H01L 23/495* | (2006.01) | |
| *H01L 23/29* | (2006.01) | |
| *H05K 3/10* | (2006.01) | |
| *H01L 21/56* | (2006.01) | |
| *H05K 1/11* | (2006.01) | |
| *H05K 1/18* | (2006.01) | |

(52) U.S. Cl.
CPC .............. *C25D 13/12* (2013.01); *H01L 21/56* (2013.01); *H01L 23/295* (2013.01); *H01L 23/49586* (2013.01); *H05K 1/119* (2013.01); *H05K 1/185* (2013.01); *H05K 3/10* (2013.01); *H05K 2201/0104* (2013.01); *H05K 2203/135* (2013.01)

(58) Field of Classification Search
CPC combination set(s) only.
See application file for complete search history.

(56) References Cited

U.S. PATENT DOCUMENTS

| | | | |
|---|---|---|---|
| 5,607,818 A | 3/1997 | Akram et al. | |
| 7,455,757 B2 | 11/2008 | Oh et al. | |
| 9,303,327 B2 | 4/2016 | Yeong et al. | |

(Continued)

FOREIGN PATENT DOCUMENTS

| | | |
|---|---|---|
| CN | 106571745 A | 4/2017 |
| EP | 0910101 A1 | 4/1999 |

(Continued)

OTHER PUBLICATIONS

U.S. Appl. No. 15/993,263, filed May 30, 2018, Yin.

(Continued)

*Primary Examiner* — Nduka E Ojeh
(74) *Attorney, Agent, or Firm* — Dority & Manning, P.A.

(57) ABSTRACT

This present disclosure generally relates to systems and methods of electrophoretic deposition (EPD) techniques for use in insulation systems at least partially encapsulating a semiconductor device, a conductive component and a substrate, such as insulation systems of semiconductor devices, busbars, or the like. Insulation systems formed using EPD processes may be designed to have a dielectric constant that decreases in a direction away from a substrate of the insulation system. This may improve insulation technologies since depositing coatings with sequentially arranged dielectric constants may improve resistance of the insulation system to high temperature, high electric fields, or the like.

25 Claims, 10 Drawing Sheets

(56) References Cited

U.S. PATENT DOCUMENTS

| | | |
|---|---|---|
| 9,313,897 B2 | 4/2016 | Mahler et al. |
| 10,008,590 B2 | 6/2018 | Schmidt |
| 2012/0024332 A1 | 2/2012 | Stefan et al. |
| 2014/0077611 A1 | 3/2014 | Young et al. |
| 2016/0300806 A1* | 10/2016 | Kim .................... H01L 23/3128 |
| 2017/0301434 A1 | 10/2017 | Chen et al. |
| 2018/0233981 A1 | 8/2018 | Yin et al. |
| 2019/0128735 A1* | 5/2019 | Cook ........................ G01J 3/12 |

FOREIGN PATENT DOCUMENTS

| | | |
|---|---|---|
| EP | 1571684 A1 | 9/2005 |
| JP | 2005251673 A | 9/2005 |

OTHER PUBLICATIONS

Lee, Saung Whan, et al.; "Rapid and multi-step, patterned electrophoretic deposition of nanocrystals using electrodes covered with dielectric barriers", vol. 104, Issue: 5, Jan. 2014.

Aoki, Yusuke; "Heat-resistant, thermally conductive coating of alumina on metal via electrophoretic deposition with added polydimethylsiloxane-based organic-inorganic hybrid materials", Polymer Bulletin, vol. 73, Issue: 9, pp. 2605-2614, Sep. 2016.

* cited by examiner

INSULATION SYSTEMS AND METHODS OF DEPOSITING INSULATION SYSTEMS

TECHNICAL FIELD

The subject matter disclosed herein relates to techniques for depositing insulation systems on semiconductor devices, busbars, and other suitable devices.

BACKGROUND

Embodiments of the disclosure generally relate to insulation systems for semiconductor devices and busbars. More particularly, embodiments of the disclosure relate to electrophoretic processes for depositing insulation systems on semiconductor devices and busbars.

Power electronic converter technology, which uses semiconductor switches to achieve full control of terminal voltages and currents, has seen tremendous advancement in applications in various power systems. This has largely been driven by the increasing availability of higher power switching devices such as those based on the SiC and GaN wide-bandgap semiconductors. These may enable a high voltage (e.g. 20 kilovolts (kV)) and/or high power (e.g., greater than 100 kilowatts (kW)) density converter with a relatively smaller size than currently available power converters. New developments in high power semiconductor switching devices hold the potential increase the power density of medium voltage (e.g., higher than 10 kV) power converters. However, this potential has not yet been fully attained due at least in part to capabilities of electrical insulation, particularly, in the packaging and connection for high voltage wide-bandgap devices. The high electric fields that go with high voltage and high rate of change of voltage (e.g., greater than 10 kV per microsecond) lead to partial discharge within the insulation and creeping discharges on surfaces of semiconductor devices and busbars of the power converters, which may dramatically reduce the insulation, and hence converter, reliability. Further, for high power density converters, high current capability (e.g., greater than 100 Amperes per squared centimeter ($A/cm^2$) as well as high thermal conductivity (e.g., greater than 10 watt per meter-kelvin (W/mK) for ceramic materials, while composite of ceramic and polymer binder varies, such as greater than 2 W/mK, generally greater than 2 W/mk) for the insulation is also desirable. Accordingly, improved insulation for power converter components, such as, semiconductor devices and busbars, and improved methods of insulating these components are desired.

BRIEF DESCRIPTION

In one aspect, the disclosure relates to a semiconductor package. The semiconductor package includes a semiconductor device disposed on a substrate; a conductive component interposed between the semiconductor device and the substrate, and an insulation system at least partially encapsulating the semiconductor device, the conductive component and the substrate. The insulation system is characterized by a dielectric constant that decreases in a direction away from the substrate, and the insulation system includes at least one composite coating that includes particles dispersed in a polymer matrix.

In another aspect, the disclosure relates to a method of packaging a semiconductor package. The semiconductor package includes a semiconductor device disposed on a substrate and a conductive component interposed between the semiconductor device and the substrate. The method includes disposing an insulation system on a least a portion of a surface of the semiconductor device, the conductive component, and the substrate, via an electrophoretic process. The insulation system is characterized by a dielectric constant that decreases in a direction away from the substrate, and the insulation system includes at least one composite coating that includes particles dispersed in a polymeric matrix.

In another aspect, the disclosure relates to a busbar laminate. The busbar laminate includes conductive elements; inner insulation coatings interspersed between the conductive elements to form a busbar stack; and an outer insulation coating at least partially encapsulating the busbar stack. The outer insulation coating is characterized by a dielectric constant that is lower than the dielectric constant of the inner insulation coatings. The inner insulation coatings and the outer insulation coating include at least one composite coating that includes particles dispersed in a polymer matrix.

In yet another aspect, the disclosure relates to a method of forming a busbar laminate. The method includes disposing inner insulation coatings between conductive elements to form a busbar stack; and at least partially encapsulating the busbar stack with an outer insulation coating. The outer insulation coating is characterized by a dielectric constant that is lower than the dielectric constant of the inner insulation coatings. The inner insulation coatings and the outer insulation coating include at least one composite coating that includes particles dispersed in a polymer matrix.

BRIEF DESCRIPTION OF THE DRAWINGS

These and other features, aspects, and advantages of the present disclosure will become better understood when the following detailed description is read with reference to the accompanying drawings, wherein.

DETAILED DESCRIPTION

Figure 1:
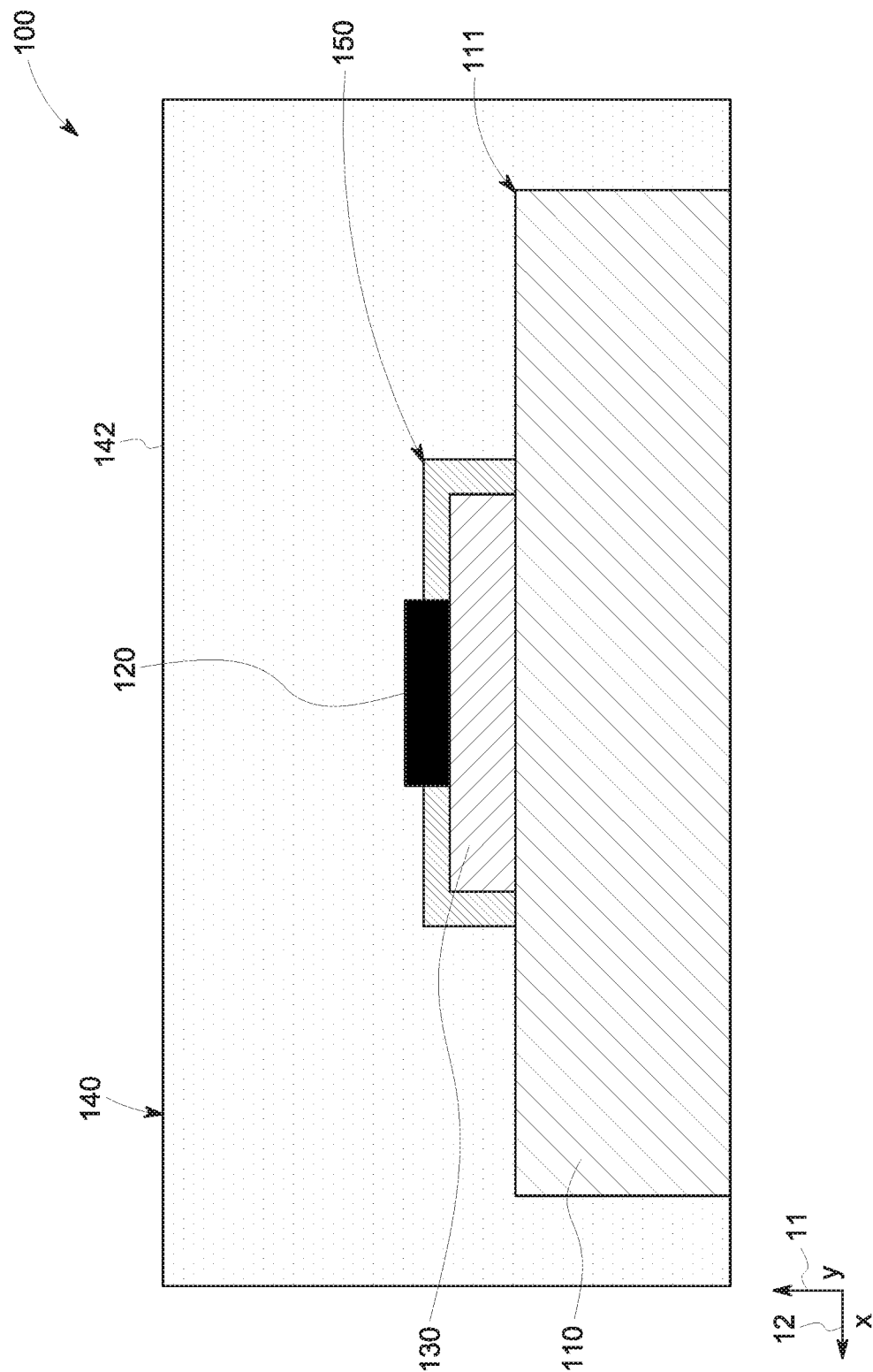
FIG. 1 is a schematic of a semiconductor package, in accordance with some embodiments of the disclosure.

One or more specific embodiments of the present embodiments described herein will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features.

Approximating language, as used herein throughout the specification and claims, may be applied to modify any quantitative representation that could permissibly vary without resulting in a change in the basic function to which it is related. Accordingly, a value solidified by a term or terms, such as "about", and "substantially" is not to be limited to the precise value specified. In some instances, the approximating language may correspond to the precision of an instrument for measuring the value. Similarly, "free" may be used in combination with a term, and may include an insubstantial number, or trace amounts, while still being considered free of the solidified term. Here and throughout the specification and claims, range limitations may be combined and/or interchanged, such ranges are identified and include all the sub-ranges contained therein unless context or language indicates otherwise.

In one aspect, the disclosure relates to a semiconductor package. The semiconductor package includes a semiconductor device disposed on a substrate; a conductive component interposed between the semiconductor device and the substrate, and an insulation system at least partially encapsulating the semiconductor device, the conductive component and the substrate. The insulation system is characterized by a dielectric constant that decreases in a direction away from the substrate, and the insulation system includes at least one composite coating that includes particles dispersed in a polymer matrix. It is noted that, the dielectric constant is described herein as a relative dielectric constant compared to a dielectric constant of air.

FIG. 1 is a schematic represented relative to an x-axis 11 and a y-axis 12 of an example semiconductor package 100, in accordance with some embodiments of the disclosure. As shown in FIG. 1, the semiconductor package 100 includes a semiconductor device 120 disposed on a substrate 110. A conductive component 130 is interposed between the semiconductor device 120 and the substrate 110. The semiconductor package 100 further includes an insulation system 140 at least partially encapsulating the semiconductor device 120, the conductive component 130 and the substrate 110. It should be understood that these layers may exist or be formed in any suitable direction.

The semiconductor package 100 may include a discrete device such as a single semiconductor device or a module such as an integrated circuit (IC). In some embodiments, the semiconductor package may be a system on chip (SoC). For example, the semiconductor package 100 may include a power semiconductor device such as a metal oxide semiconductor field effect transistor (MOSFET), a bipolar transistor, a junction field effect transistor (JFET), an insulated gate bipolar transistor (IGBT), a thyristor or a diode. Alternatively, the semiconductor package 100 may be a resistor, a protective device, a capacitor, a sensor or a detector, for example.

The semiconductor device 120 may be made of silicon, germanium, silicon-germanium (SiGe), gallium arsenide (GaAs), indium phosphide (InP), gallium nitride (GaN), silicon carbide (SiC), diamond, gallium oxide ($Ga_2O_3$), or the like. In certain embodiments, the semiconductor device 120 is a wide-gap (WG) semiconductor device. Non-limiting examples of suitable wide-gap semiconductor devices include SiC or GaN-based devices. In some embodiments, the semiconductor device 120 is a MOSFET, a bipolar transistor, a junction field effect transistor (JFET), an insulated gate bipolar transistor (IGBT), a thyristor, or a diode. In certain embodiments, the semiconductor device 120 is a SiC-based switching device such as a SiC-based transistor. The substrate 110 may be a ceramic substrate in accordance with some embodiments of the disclosure and the conductive component 130 may include copper, aluminum or silver.

As noted earlier, the insulation system 140 is characterized by a dielectric constant that decreases in a direction away from the substrate 110. Referring again to FIG. 1, the substrate 110 is characterized by atop surface 111 and the insulation system 140 is characterized by a dielectric constant that decreases in a direction away from the top surface 111. For example, in FIG. 1, the dielectric constant of the insulation system 140 decreases in the directions x and y. In some embodiments, the insulation system 140 may be characterized by a step change in the dielectric constant in the directions x and y (e.g., step down change). In some other embodiments, the insulation system 140 may be characterized by a gradual change (e.g., linearly reducing change) in the dielectric constant in the directions x and y. In some embodiments, the dielectric constant of the portion of the insulation system 140 that is proximate to the top surface 111 of the substrate 110 may be similar to the dielectric constant of the substrate 110, and may decrease in the directions x and y. The insulation system 140 may include any suitable polymeric material, for example, a thermoset resin, in accordance with some embodiments of the disclosure. For example, the insulation system 140 may include a polymer material 142 that is used in packaging for encapsulation the device and/or a material used to encapsulate the device without being formed using an electrophoretic deposition (EPD) process.

The insulation system 140 further includes at least one composite coating 150 including particles dispersed in a polymer matrix, as shown in FIG. 1. The term "particles," as used herein, encompasses any suitable geometric shape and size employed along with the polymer matrix to form the composite coating 150. Non-limiting examples of suitable particle forms include spherical particles, nanotubes (e.g., nanotubes of single and/or multiple walls, nanotubes of different chirality), nanofibers, nanowires, nanowhiskers, irregular shapes, or the like. The sizes (e.g., diameter, length, width, characteristic length, aspect ratio) of the particles may also be in any suitable range, from nanometer (nm) range to micrometer (μm) range.

Figure 2:
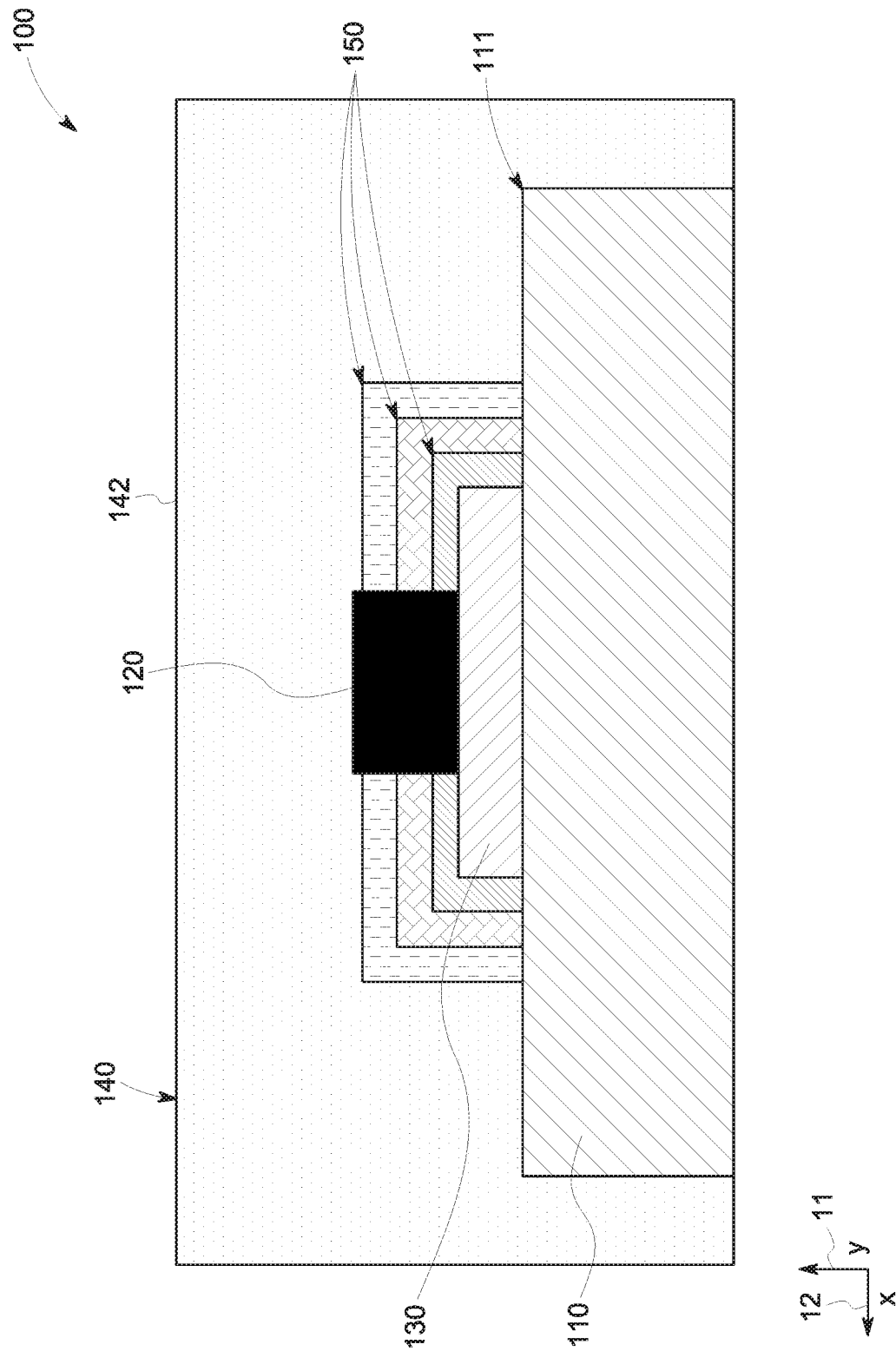
FIG. 2 is a schematic of a semiconductor package, in accordance with some embodiments of the disclosure.

In some embodiments, the particles may include a thermally conductive ceramic material. The term "thermally conductive ceramic material" refers to a ceramic material having a thermal conductivity greater than 10 watt per meter-kelvin (W/mK). In some embodiments, the particles may include boron nitride particles, aluminum nitride particles, alumina particles, silicone oxide particles, aluminum silicate particles, mica particles, titanium oxide particles, barium titanium oxide particles, and/or strontium titanium oxide particles, or the like. Further, in some embodiments, the polymer matrix includes a thermoset resin, such as epoxy, siloxane, polyester, polyurethane, cyanate ester, polyimide, polyamide, polyamideimide, polyesterimide, and/or polyvinyl ester, or the like In some embodiments, the insulation system 140 includes two or more composite coatings 150. For example, FIG. 2 is a schematic of a semiconductor package 100 that includes multiple (e.g., three) composite coatings 150. Each composite coating 150 may include a polymer matrix and particles dispersed in the polymer matrix. Furthermore, in some cases, each composite coating 150 may be characterized via differing dielectric constants (e.g., a first composite coating having a relative dielectric constant to air of greater than 20, a second composite coating having a relative dialectic constant greater than 5, a third composite coating having a relative dielectric constant of 2.5 to 3.5). For example, a first composite coating 150 may have a different dielectric constant from a second composite coating 150. The semiconductor package 100 may include any suitable number of composite coatings have any suitable combination of dielectric constants.

Figure 3:
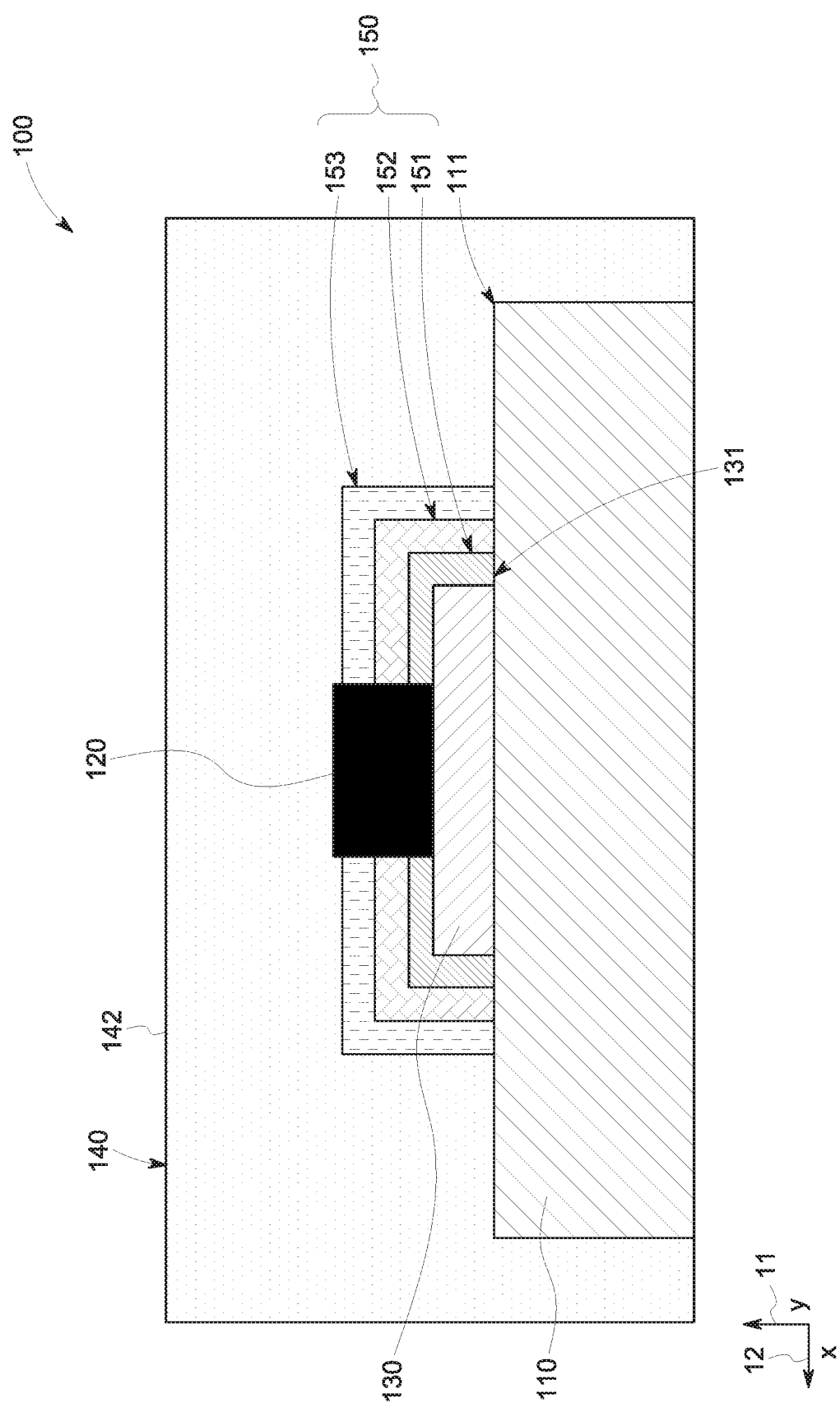
FIG. 3 is a schematic of a semiconductor package, in accordance with some embodiments of the disclosure.

An example of this is shown in FIG. 3. FIG. 3 is a schematic of a semiconductor package 100 that includes multiple composite coatings 150 (e.g., a first composite coating 151, a second composite coating 152, and a third composite coating 153). The first composite coating 151 may be disposed adjacent to the semiconductor device 120, the conductive component 130, and the substrate 110. The second composite coating 152 is disposed adjacent to the semiconductor device 120, the first composite coating 151, and the substrate 110. The third composite coating 153 is disposed adjacent to the second composite coating 152 and the substrate 110. In this example, a dielectric constant of the first composite coating 151 is greater than a dielectric constant of the second composite coating 152, and the dielectric constant of the second composite coating 152 is greater than a dielectric constant of the third composite coating 153. By varying the dielectric constants of the composite coating 151, 152, 153 layers, a gradient in dielectric constant is created within the insulation system 140.

As noted earlier, a dielectric constant of the first composite coating 151 may be similar to the dielectric constant of the substrate 110. In some embodiments, the dielectric constant of the first composite coating 151 is in a range from about 20 to about 200, the dielectric constant of the second composite coating 152 is in a range from about 5 about 20, and the dielectric constant of the third composite 153 coating is in a range from about 2 to about 5.

The dielectric constant of the composite coatings 150 in FIGS. 2 and 3 may be varied by varying one or more of the type of particles in the composite coating, the amount of particles in the composite coating, and/or the distribution of the particles in the composite coating. For example, in some embodiments, with reference to FIG. 3, the dielectric constant of the composite coatings 150 may be varied by varying the type of particles (i.e., by employing particles with different dielectric constants) in each of the composite coatings 151, 152, 153. Similarly, in some other embodiments, the dielectric constant of the composite coatings 150 may be varied by varying the amount of the particles in each of the composite coatings 151, 152, 153. In some embodiments a combination of one or more of the type of particles in the composite coating, the amount of particles in the composite coating, and/or the distribution of the particles in the composite coating may be employed to vary the dielectric constants in each of the composite coatings 151, 152, 153. In some embodiments, the dielectric constant of the composite coatings 150 may be varied by using a non-linear dielectric particle (e.g., when dielectric constant increases with electric field increases to facilitate smoothing the electric field) in the composite coatings 150.

As mentioned earlier, in typical semiconductor packages (e.g., silicon carbide (SiC) device packages), high voltages may cause excessively large electric fields, particularly at a triple point 131 of the conductive component 130, the substrate 110 and the insulation system 140. In the absence of the gradient in dielectric constant in the insulation system 140, high electric field (e.g., a relatively higher electric field that expected during a normal use of the insulation system 140) may be generated in the insulation system 140 at the triple point 131 because the typical insulation system 140 has a dielectric constant much lower than that of the substrate 110. These high dielectric fields may generate electrical discharge in the insulation system 140 proximate to the substrate 110, eventually resulting in undesired device operation or electrical fault.

By employing multiple composite coatings 150 of varying dielectric constants in the insulation system 140 (as shown in FIG. 3), the electric field in the insulation system 140 may be capacitively graded (e.g., capacitive electric stress grading), and thus may reduce the electric field associated with the triple point 131. As described above, in some embodiments, using a first composite coating 151 proximate to the triple point with a dielectric constant similar to that of the substrate 110, followed by a second composite coating 152 which has a dielectric constant higher than that of the insulation system 140 but lower than that of the first composite coating 151, may provide the capacitive grading for the insulation system 140. Furthermore, composite coatings in accordance with embodiments of the disclosure may enable high current capability and high thermally conductivity in insulation systems of semiconductor devices employed, for example, in high power density converters.

In some embodiments, the insulation system 140 may be formed using electrophoretic deposition (EPD). The EPD approach may improve insulation formation by providing for a high particle loading (e.g., greater than 50% volume fraction) in the composite coatings. The high particle loading provides for a high dielectric constant and a high thermal conductivity. Additionally, multiple coatings with different dielectric constant materials may be deposited sequentially to create capacitive electric stress grading to overcome high electric field generated by fast switching. Furthermore, EPD may be applied on any conductive surfaces regardless of its shape and geometry. EPD also provides the flexibility to make multifunctional and multicoating coatings with varied dielectric constant and thermal conductivity as well as coating thickness.

A method of packaging a semiconductor package 100 is also presented. Referring again to FIG. 1, the semiconductor package 100 includes a semiconductor device 120 disposed on a substrate 110, and a conductive component 130 interposed between the semiconductor device 120 and the substrate 110. The method includes disposing an insulation system 140 on a least a portion of a surface of the semiconductor device 120, the conductive component 130, and the substrate 110, via an EPD process. As noted earlier, the insulation system 140 is characterized by a dielectric constant that decreases in a direction away from the substrate 110, and the insulation system 140 includes at least one composite coating 150 that includes particles dispersed in a polymeric matrix.

Referring to FIG. 2, in some embodiments, disposing the insulation system includes disposing composites coatings 150 via an EPD process. Each composite coating of the composite coatings 150 includes a polymer matrix and particles dispersed in the polymer matrix, and each composite coating of the composite coatings 150 is characterized by a differing dielectric constants.

Figure 4:
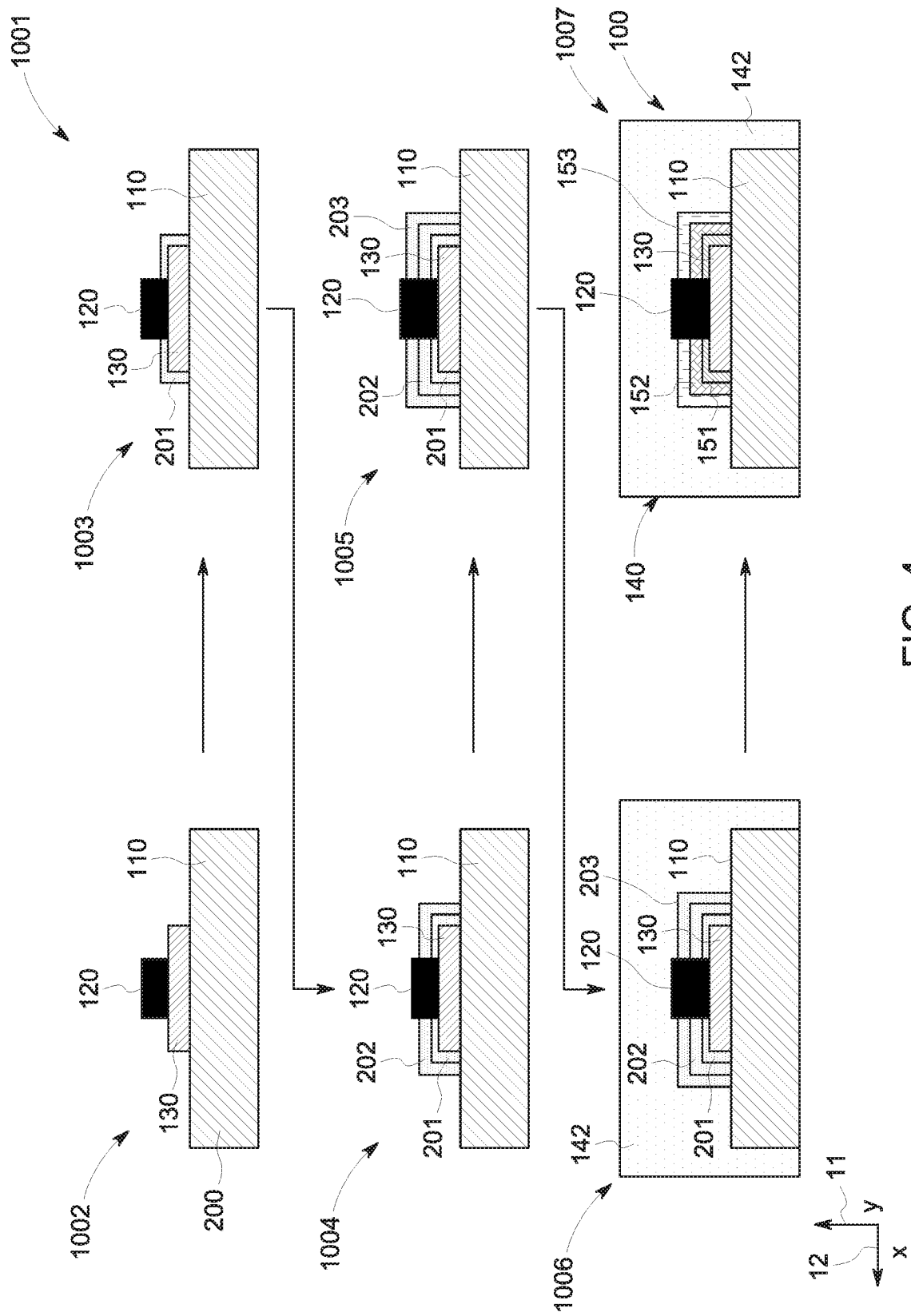
FIG. 4 is a schematic of the process of packaging a semiconductor component, in accordance with some embodiments of the disclosure.
Figure 5:
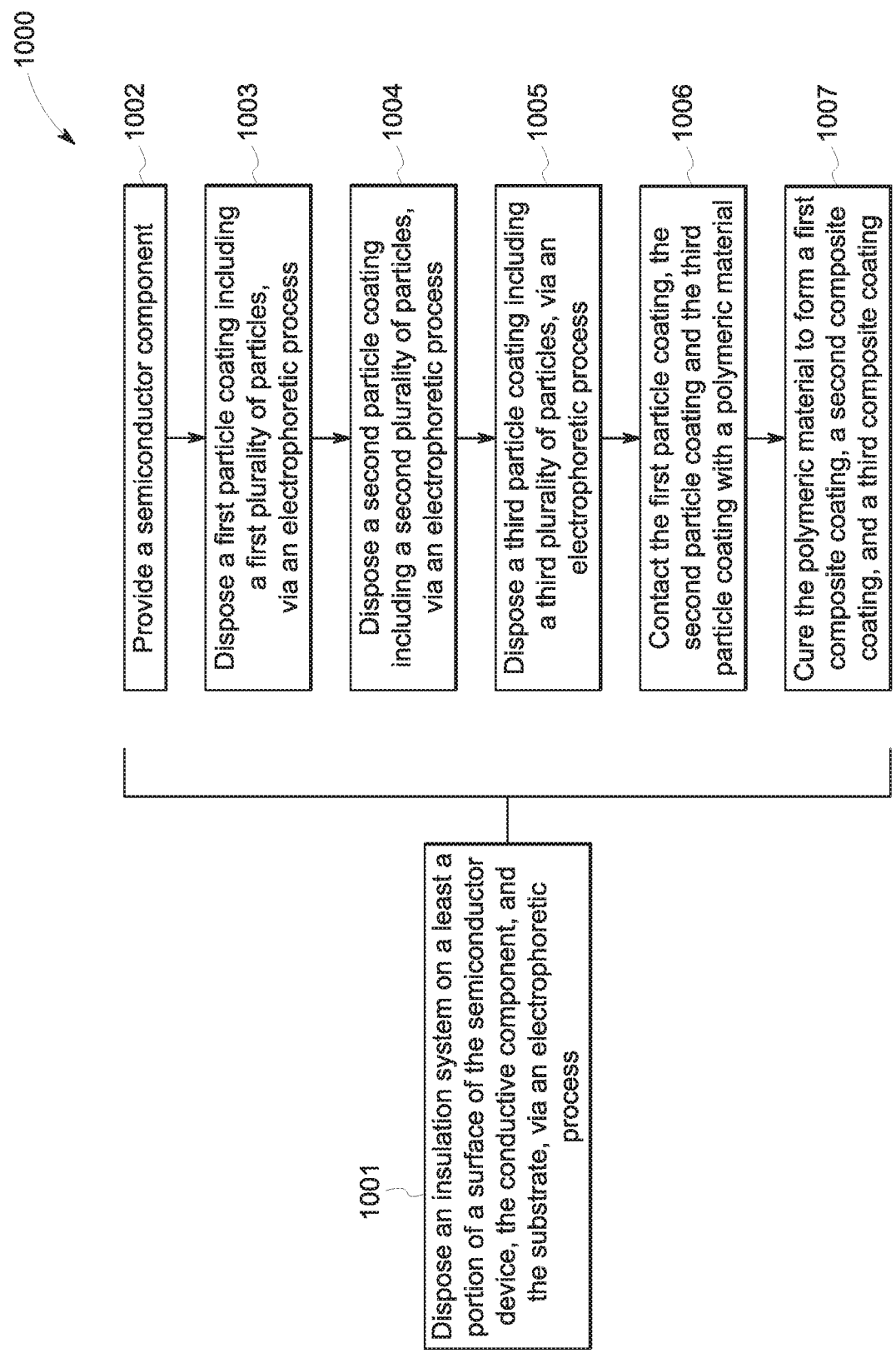
FIG. 5 is a flow chart for packaging a semiconductor component, in accordance with some embodiments of the disclosure.

Referring to FIGS. 4 and 5, a method 1000 of packaging a semiconductor component 200 is presented. Although depicted as including three particle coatings 201, 202, 203, it should be understood that more or less than three particle coatings may be used (e.g., at least two particle coatings, at least two composite coatings). For example, two particle coatings 201, 202 may be applied to create composite coatings 151, 152 without composite coating 153 by excluding operations of block 1005 when performing the method 1000.

As noted earlier, the method 1000 includes disposing 1001 an insulation system 140 on a least a portion of a surface of the semiconductor device 120, the conductive component 130, and the substrate 110, via an EPD process. The disposing 1001 includes, at block 1002, providing the component 200 including the semiconductor device 120 disposed on the substrate 110 with a conductive component 130 disposed therebetween. At block 1003, the disposing 1001 includes disposing a first particle coating 201 including a first set of particles adjacent to the semiconductor device 120, the conductive component 130, and the substrate 110, via an EPD process. At block 1004, the disposing 1001 includes disposing a second particle coating 202 including a second set of particles adjacent to the semiconductor device 120, the first particle coating 201, and the substrate 110, via an EPD process. At block 1005, the disposing 1001 includes disposing a third particle coating 203 including a third set of particles adjacent to the second particle coating 202 and the substrate 110, via an EPD process.

At block 1006, disposing 1001 includes contacting the first particle coating 201, the second particle coating 202 and the third particle coating 203 with a polymeric material 142. And, at block 1007, the disposing 1001 includes curing a polymeric material 142 to form a first composite coating 151, a second composite coating 152, and a third composite coating 153. The first composite coating 151 may include the first set of particles dispersed in the polymer matrix. The second composite coating 152 may include the second set of particles dispersed in the polymer matrix. The third composite coating 153 may include the third set of particles dispersed in the polymer matrix. As noted earlier, a dielectric constant of the first composite coating 151 is greater than a dielectric constant of the second composite coating 152, and the dielectric constant of the second composite coating 152 is greater than a dielectric constant of the third composite coating 153.

Figure 6:
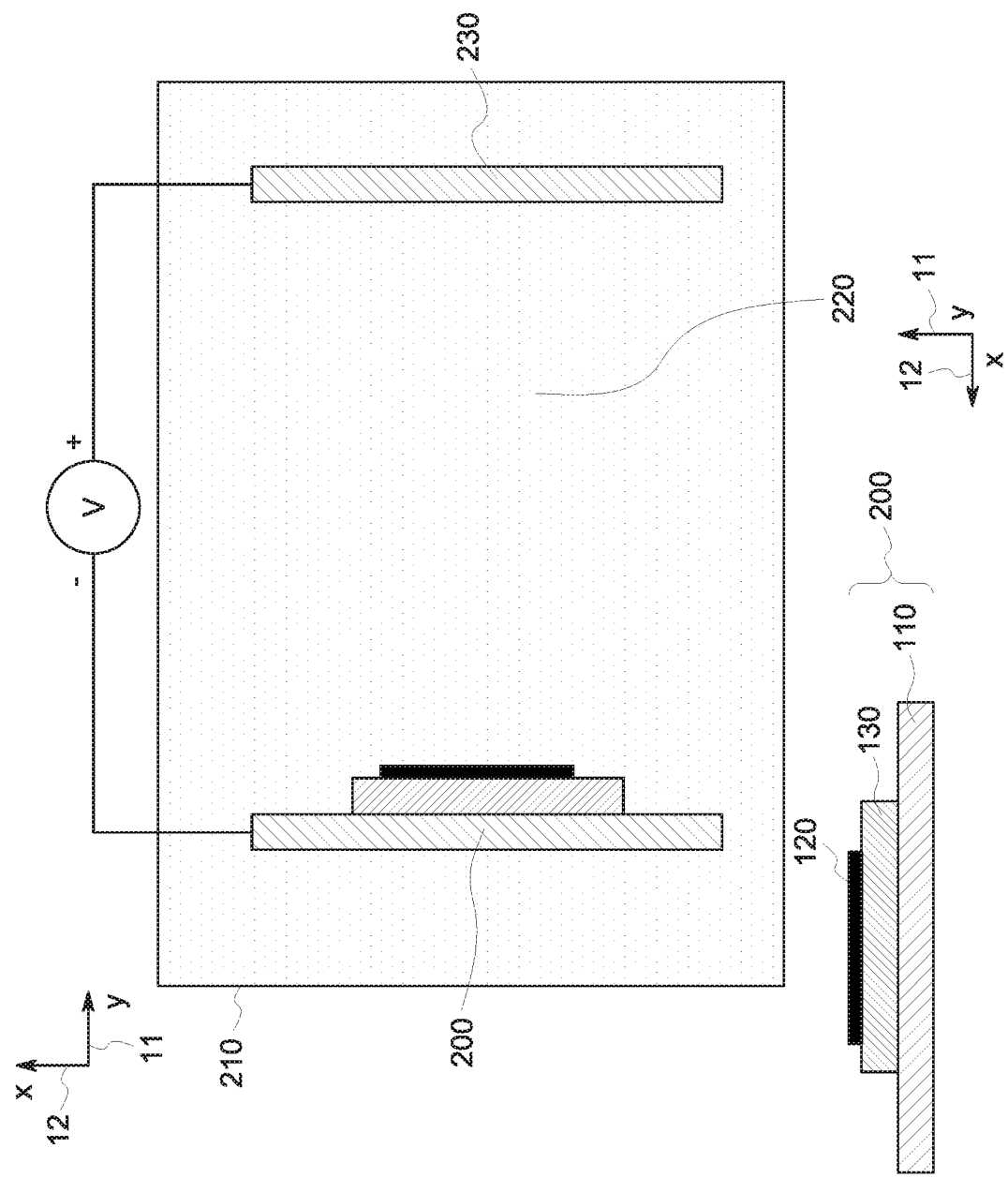
FIG. 6 is a schematic of an electrophoretic deposition set-up for packaging a semiconductor component, in accordance with some embodiments of the disclosure.

The EPD process described above is further described with reference to FIG. 6. The EPD process may involve submerging a semiconductor component 200 into a container 210 that holds a coating composition 220, and applying an electrical current through the coating composition 220. Typically, the component 200 to be coated serves as one of the electrodes (e.g., anode or cathode), and one or more suitable counter-electrodes are used to complete the circuit. For example, FIG. 6 illustrates an example single counter electrode 230 that completes the circuit. There are two principle types of EPD processes, anodic and cathodic. In the anodic EPD process, negatively charged materials in the coating composition 220 are deposited on a positively charged workpiece. In the cathodic process, positively charged materials in the coating composition 220 are deposited on a negatively charged workpiece. As illustrated, the component 200 includes a semiconductor device 120 disposed on a substrate 110 and a conductive component 130 interposed between the semiconductor device 120 and the substrate 110.

The coating composition 220 includes particles in a suitable solvent. Non-limiting examples of suitable solvents include acetylacetone, ethanol, isopropylalchol, or combinations thereof. In certain embodiments, the coating composition 220 is the form of a slurry (e.g., polar solvent having a relative dielectric constant greater than 15 to facilitate ion dissociation).

The chemistries, the size, and/or the concentration (e.g., volume percentage) of the particles in the coating composition 220 may control the dielectric constant of the composite coatings and/or control the morphology of the composite coatings. For example, the packing density (e.g., percentage volume) of ceramic particles changes with the parameters mentioned above. The packing density in turn may alter the dielectric constant, such that a higher density leads to a higher dielectric constant. In some embodiments, parameters, such as pH (e.g., potential of hydrogen) level and/or zeta potential (e.g., electrokinetic potential in colloidal dispersions) may be modified to change the charging behavior of the ionized groups to form a stable composite coating, for example by employing a charging agent. In some embodiments, suitable solvents, surfactants, and/or additives may be used to form a stable composite coating. In some embodiments, the viscosity of the coating composition 220 may be modified to form a stable composite coating and/or to improve the morphology of the composite coating. In some embodiments, suitable adhesion promoters may be added to the coating composition 220 to improve the adhesion of the particles on the surfaces of the component 200.

Before the EPD process, the component 200 may be prepared to make the component 200 more suitable for the coating process. In some embodiments, the preparation includes applying one or more masks (e.g., masking tape, any suitable electrically insulating material) on the component 200 to be coated before submerging the component 200 to be coated into the coating composition 220. In some embodiments, the preparation may also include any suitable cleaning processes to clean the component 200 to be coated or applying a suitable pre-coating, such as a primer coating, to the component 200 to be coated. A primer coating may improve adhesion between the particles and the surfaces of the component 200 to be coated.

The EPD process of FIG. 6 may include submerging the component 200 to be coated as one of the electrodes (e.g., anode or cathode) in the coating composition 220, and submerging a counter electrode 230 to set up a complete electrical circuit, followed by application of direct electrical current through the coating composition 220 using the electrodes (e.g., component 200 and counter electrode 230). Parameters that affect the EPD process may be controlled to achieve the desired qualities for the composite coating. These parameters may include, for example, applied voltage, coating temperature, coating time, coating or deposition rate, or the like. These parameters may affect the deposition kinetics to change the quality or characteristics of the composite coating (e.g., thickness, morphology, uniformity, surface coverage).

As noted earlier, the method 1000 may, in some cases, include disposing particle coatings 201, 202, 203 sequentially on the component 200 (e.g., generally blocks 1003, 1004, 1005). In such instances, the method 1000 may include sequentially submerging the component 200 in the coating composition 220 and performing an EPD process to form the particle coating 201, 202, 203.

After deposition of each particle coating 201, 202, 203 on the component 200, the coated component may be post-processed. Post-processing the coated component may include rinsing the component 200 to remove excess coating composition 220 from the component 200. In certain embodiments, if one or more masks (e.g., masking tape) were applied to the coated components, the masks may be removed and/or reapplied after each EPD process operation.

As mentioned earlier, after the EPD process, and any post-processing operations, the component 200 includes a coating of particles deposited on surfaces of the component. In some embodiments, the particle coatings 201, 202, 203 may include an interconnected network of ceramic particles. The particle coatings 201, 202, 203 may further include voids or gaps between the ceramic particles, and these voids or gaps may be at least partially filled by impregnating a polymeric material 142 in these voids or gaps to form the composite coatings 151, 152, 153 (e.g., generally blocks 1006, 1007).

As noted earlier, the dielectric constant of the composite coatings 150 is varied by varying one or more of the type of particles in the composite coating, the amount of particles in the composite coating, or the distribution of the particles in the composite coating. For example, in some embodiments, the dielectric constant of the composite coatings 150 may be varied by varying the type of particles (i.e., by employing particles with different dielectric constants) used in each of the EPD process at blocks 1003, 1004, 1005. Similarly, in some other embodiments, the dielectric constant of the composite coatings 150 may be varied by varying the amount of the particles in the coating composition 220 during the EPD process at blocks 1003, 1004, 1005. In some embodiments, a combination of one or more of the type of particles in the composite coating, the amount of particles in the composite coating, or the distribution of the particles in the composite coating may be used to vary the dielectric constants of each particle coating 201, 202, 203. In some embodiments, the dielectric constant of the composite coatings 150 may be varied by using a non-linear dielectric particle in the coating composition 220. Varying these properties may enable dielectric constants of different layers (e.g., composite coatings 150, polymeric material layer 142) to vary between layers by using same or different particles and/or by using different concentration levels of the particles in a direction of the expected electric field.

In some embodiments, the deposited particles may be subjected to one or more heat treatment operations before contacting the particle coatings 201, 202, 203 with the polymeric material 142, as described in more detail below. By heat-treating the deposited particles, partial or complete sintering of the particles may be achieved. Sintering may provide improved mechanical integrity of the deposited particle coatings 201, 202, 203 during subsequent contacting impregnation operations. Further, partial or completely sintered particles may result in improved thermal conductivity of the composite coatings 150.

Referring back to FIGS. 4 and 5, the method 1000 further includes, at block 1006, contacting the particle coatings 201, 202, 203 deposited by the EPD process with a polymeric material 142 to form the composite coatings 151, 152, 153. The particle coatings 201, 202, 203—may be contacted with the polymeric material 142 using any suitable technique, such as, for example an immersion process or a vacuum pressure impregnating process. An example polymeric material 142 is a material used for resin encapsulation, such as silicone gel. The technique and/or the conditions used for the contacting step map depends, at least in part, on the characteristics of the polymeric material 142. For example, for a low viscosity polymeric material 142, such as, epoxy or silicone, an immersion process or a vacuum pressure impregnation process may be employed. However, for high-viscosity thermoplastic materials or polymeric materials 142, high pressure impregnation may be employed, for example by using an autoclave. The method 1000 may also include impregnating the polymeric material 142 (e.g., a thermoset resin) into voids present in the particle coatings 201, 202, 203—deposited by the EPD process on the surface of the component 200.

Subsequently, the method 1000 further includes, at block 1007, post-processing the impregnated coating to form the composite coatings 151, 152, 153. Post-processing of the impregnated coating may include melting or curing the polymeric material 142. Post-processing may include subjecting the impregnated coating to any suitable treatment to achieve one or more of partial curing of the polymeric material 142, complete curing of the polymeric material 142, partial melting of the polymeric material 142, and/or complete melting of the polymeric material 142. The melting or curing of the polymeric material 142 in the second coating may be achieved using any suitable treatments, such as by heat, ultraviolet (UV) light, infrared (IR) light, plasma and/or electron beam energy.

In certain embodiments, the method includes curing the thermoset resin to form the composite coatings 151, 152, 153. In some embodiments, the curing operations may include suitable treatments to crosslink the deposited thermoset resin, such as treatments that includes use of heat, ultraviolet (UV) light, infrared (IR) light, and/or electron beam energy. Additionally, heat treatment or curing process may substantially reduce or eliminate the gaps, voids, and/or factures in the as-deposited impregnated coating to form a continuous, conformal coating on the component 200.

In some embodiments, a busbar laminate is presented. The busbar laminate includes conductive elements and inner insulation coatings interspersed between the conductive elements to form a busbar stack. The busbar laminate further includes an outer insulation coating at least partially encapsulating the busbar stack, wherein the outer insulation coating is characterized by a dielectric constant that is lower than the dielectric constant of the inner insulation coatings. The inner insulation coatings and the outer insulation coating include at least one composite coating that includes particles dispersed in a polymer matrix.

Figure 7:
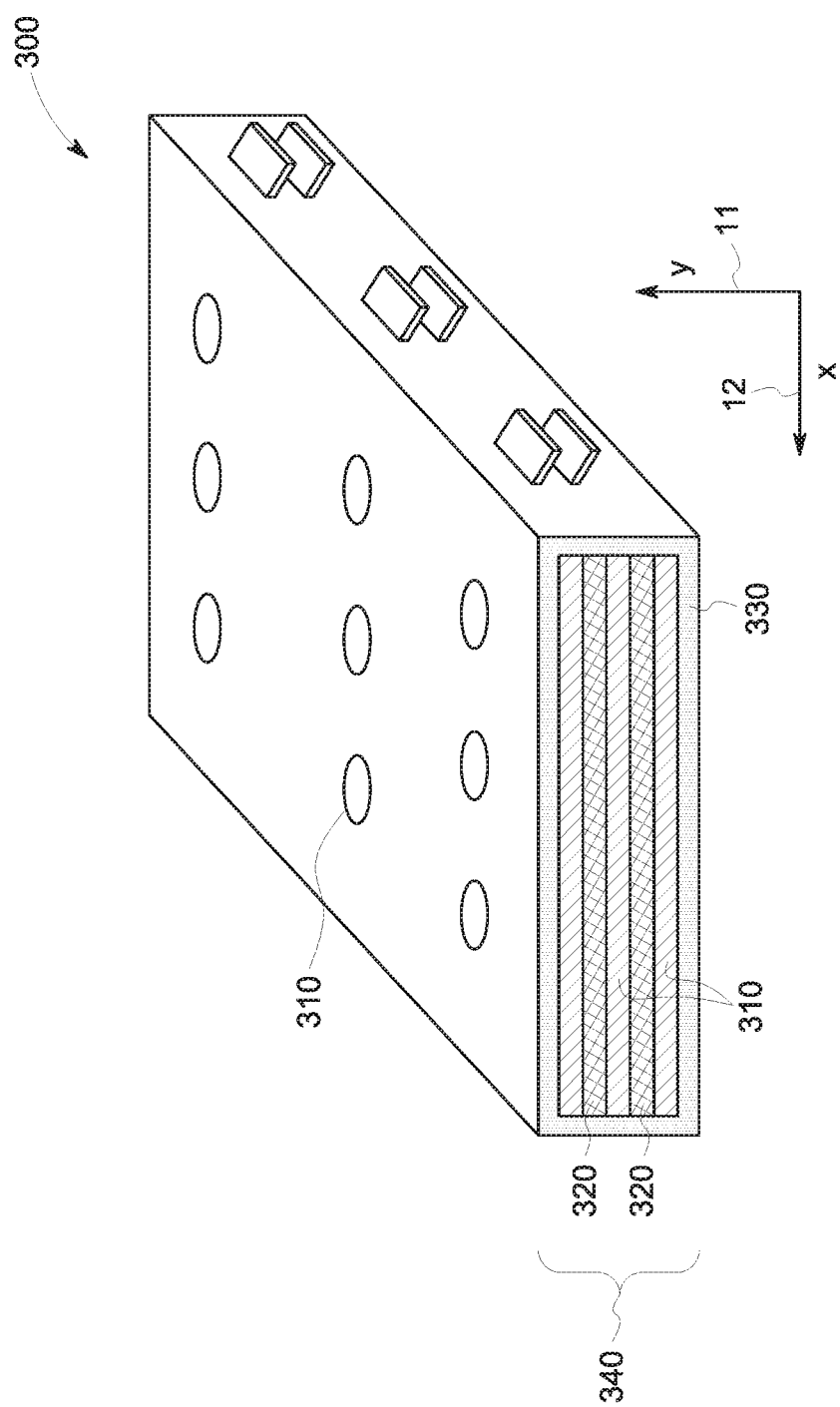
FIG. 7 is a schematic of a busbar laminate, in accordance with some embodiments of the disclosure.

FIG. 7 is a schematic of an example busbar laminate 300, in accordance with some embodiments of the disclosure. As shown in FIG. 7, the busbar laminate 300 includes conductive elements 310 and inner insulation coatings 320 interspersed between the conductive elements 310 to form a busbar stack 340. The busbar laminate 300 may also include an outer insulation coating 330 at least partially encapsulating the busbar stack 340.

A dielectric constant lower than the dielectric constant of the inner insulation coatings 320 may characterize the outer insulation coating 330. For example, the dielectric constant of the inner insulation coatings 320 may range from about 5 to about 100, and the dielectric constant of the outer insulation coating 330 may range from about 2 to about 5.

Further, the inner insulation coatings 320 and the outer insulation coating 330 may each include at least one composite coating that includes particles dispersed in a polymer matrix. In some embodiments, at least one of the inner insulation coatings 320 may include the composite coating. In some other embodiments, the outer insulation coating 330 may include the composite coating.

In certain embodiments, each coating of the inner insulation coatings 320 includes a composite coating and the outer insulation coating 330 also includes a composite coating. In such instances, each coating of the inner insulation coatings 320 includes a first set of particles dispersed in the polymer matrix, and the outer insulation coating 330 includes a second set of particles dispersed in the polymer matrix. The dielectric constant of the insulation coatings 320, 330 may be varied by varying one or more of the type of particles in the insulation coating, the amount of particles in the insulation coating, or the distribution of the particles in the insulation coating.

In some embodiments, the first set of particles is selected from the group consisting of titanium oxide particles, barium titanium oxide particles, and/or strontium titanium oxide particles, or the like. In some embodiments, the second set of particles is selected from the group consisting of boron nitride particles, aluminum nitride particles, and/or alumina particles, or the like. Further, in some embodiments, the polymer matrix includes a thermoset resin selected from the group consisting of epoxy, siloxane, polyester, polyurethane, cyanate ester, polyimide, polyamide, polyamideimide, polyesterimide, and/or polyvinyl ester, or the like.

As noted earlier, when using at least medium voltage switching devices, the electric field within laminated busbar technology may cause partial discharge within the insulation. The insulation systems used in some busbar laminates are not partial discharge resistant, and thus thickness of insulation coatings are sometimes increased to increase reliability of a system. The increase of thickness of insulation may lead to worsened voltage overshoot (e.g., overshooting of higher voltages) and lowered power densities (e.g., lower power densities than generally desired). Systems and methods of the present disclosure may address these noted shortcomings by using high dielectric constant inner insulation coatings to achieve high capacitive coupling, and by using a low dielectric constant outer insulation coating to limit surface electric field while providing corona and tracking resistance. Furthermore, composite coatings in accordance with embodiments of the disclosure may enable high current capability and high thermally conductivity in insulation systems of busbar laminates employed, for example, in high power density converters.

In some embodiments, a method of forming a busbar laminate is also presented. The method includes disposing inner insulation coatings between conductive elements to form a busbar stack. The method further includes at least partially encapsulating the busbar stack with an outer insulation coating. A dielectric constant lower than the dielectric constant of inner insulation coatings may characterize the outer insulation coating. Furthermore, the inner insulation coatings and the outer insulation coating may include at least one composite that includes particles dispersed in a polymer matrix.

Figure 8:
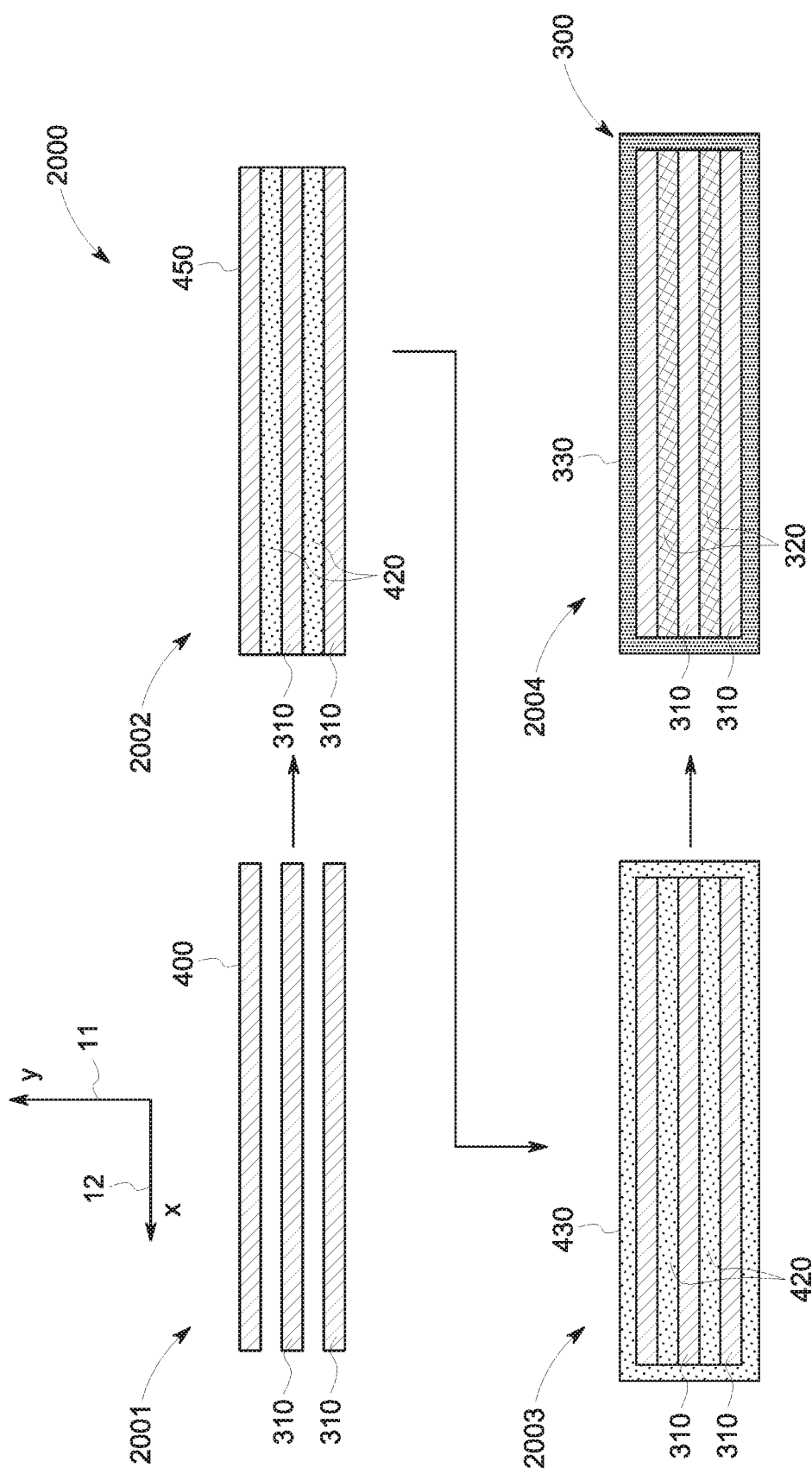
FIG. 8 is a schematic of the process of insulating a busbar laminate, in accordance with some embodiments of the disclosure.
Figure 9:
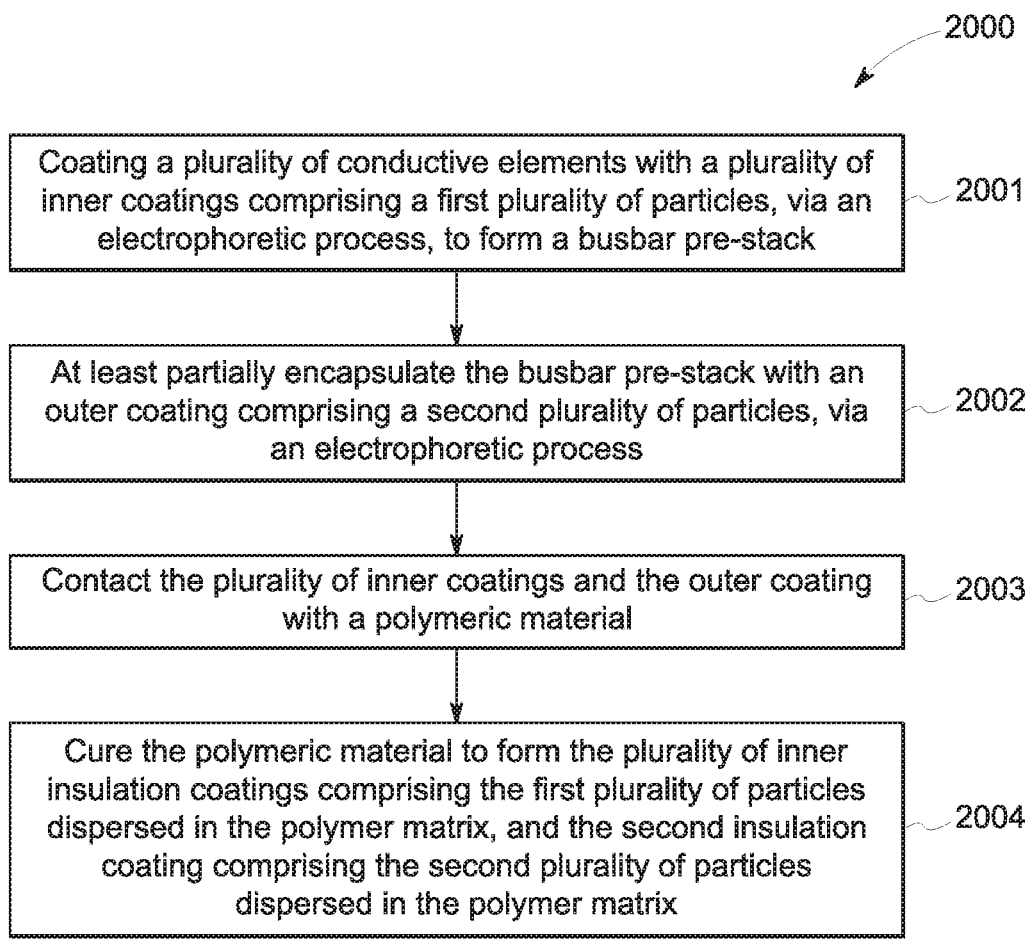
FIG. 9 is a flow chart for insulating a busbar laminate, in accordance with some embodiments of the disclosure.
Figure 10:
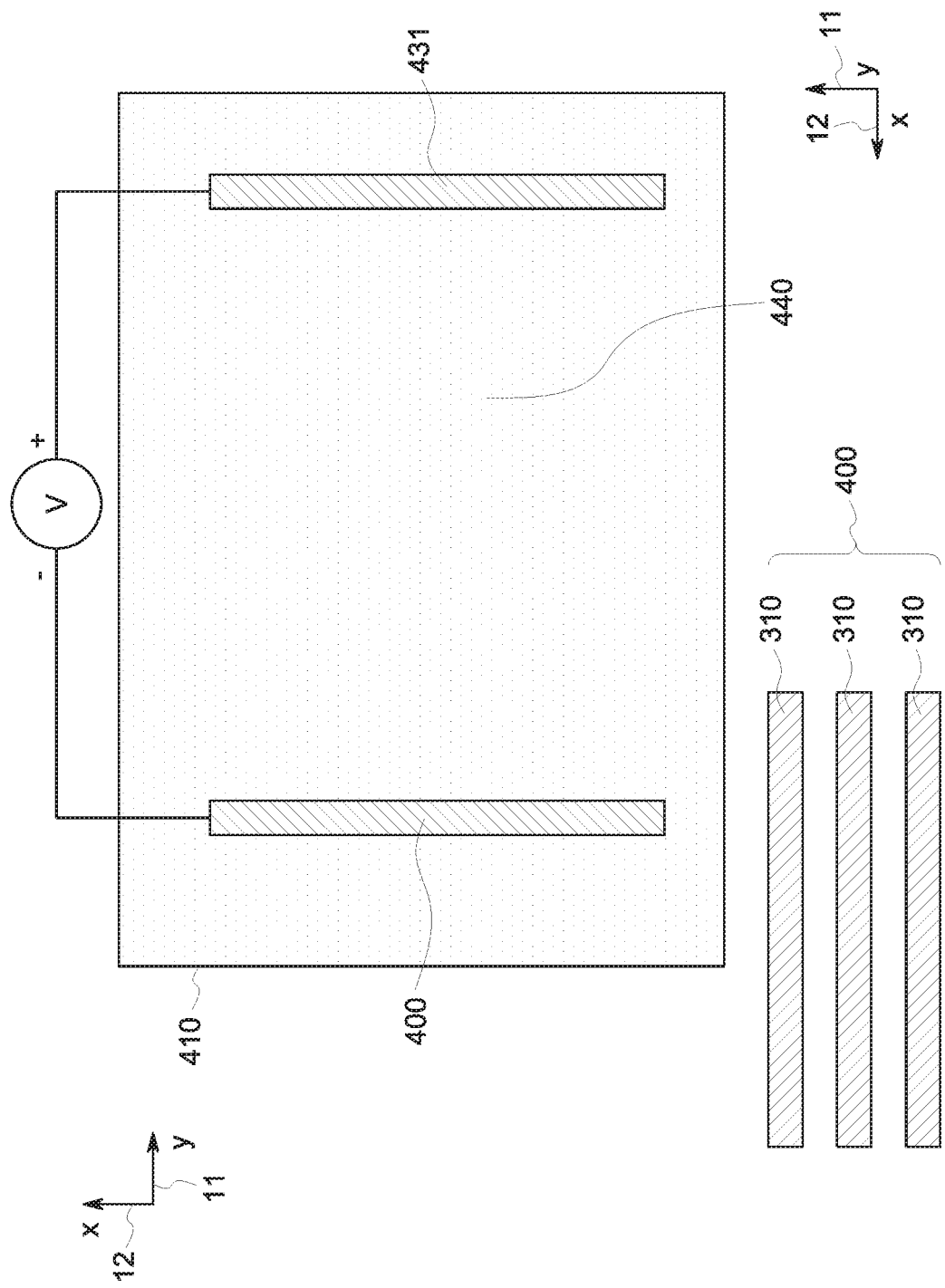
FIG. 10 is a schematic of an electrophoretic deposition set-up for insulating a busbar laminate, in accordance with some embodiments of the disclosure.

Referring to FIGS. 8-10, a method 2000 of forming a busbar laminate 300 is presented. The method 2000 includes, at block 2001, providing a component 400 including conductive elements 310. The method 2000 further includes, at block 2002, coating the conductive elements 310 with inner particles coatings 420 including a first set of particles, via an EPD process, to form a busbar pre-stack 450. The method 2000 further includes, at block 2003, at least partially encapsulating the busbar pre-stack 450 with an outer particle coating 430 including a second set of particles, via an EPD process.

The EPD process is further described in reference to FIG. 10. The EPD process may include submerging a component 400 including conductive elements 310 into a container 410 that holds a coating composition 440, and applying an electrical current through the coating composition 440. Typically, the component 400 to be coated serves as one of the electrodes (e.g., anode or cathode), and one or more suitable counter-electrodes are used to complete the circuit. For example, in FIG. 10, a single counter electrode 431 is illustrated that completes the circuit. There are two principles types of EPD processes, anodic and cathodic. In the anodic EPD process, at block 2001, negatively charged materials in the coating composition 440 are deposited on a positively charged workpiece, while in the cathodic process, at block 2001, positively charged materials in the coating composition 440 are deposited on a negatively charged workpiece.

The coating composition 440 includes the particles in a suitable solvent. Non-limiting examples of suitable solvents include acetylacetone, ethanol, and/or isopropylalchol, or the like. In certain embodiments, the coating composition 440 is the form of a slurry.

The chemistries, the size, and/or the concentration (e.g., volume percentage) of the particles in the coating composition 440 may control the dielectric constant of the composite coatings and/or control the morphology of the composite coatings. In some embodiments, parameters, such as pH (e.g., potential of hydrogen) level and/or zeta potential (e.g., electrokinetic potential in colloidal dispersions) may be modified to change the charging behavior of the ionized groups to form a stable composite coating, for example by employing a charging agent. In some embodiments, suitable solvents, surfactants, and/or additives may be used to form a stable composite coating. In some embodiments, the viscosity of the coating composition 440 may be modified to form a stable composite coating and/or to improve the morphology of the composite coating. In some embodiments, suitable adhesion promoters may be added to the coating composition 440 to improve the adhesion of the particles on the surfaces of the component 400. Varying these properties may enable dielectric constants of different layers (e.g., composite coatings 150, polymeric material layer) to vary between layers by using same or different particles and/or by using different concentration levels of the particles in a direction of the expected electric field.

Before the EPD process (e.g., before the block 2001), the component 400 may be prepared to make the component 400 more suitable for the coating process. In some embodiments, the preparation includes applying one or more masks (e.g., masking tape) on the component 400 to be coated before submerging the component 400 to be coated into the coating composition 440. In some embodiments, the preparation may also include any suitable cleaning processes to clean the component 400 or applying a suitable pre-coating, such as a primer coating, to the component 400 for coating. A primer coating may improve adhesion between the particles and the surfaces of the component 400 to be coated.

With continued reference to FIG. 10, the method 2000, at blocks 2001 2002, may include submerging the component 400 to be coated as one of the electrodes (e.g., anode or cathode) in the coating composition 440, and submerging a counter electrode 431 to set up a complete electrical circuit. After submerging the counter electrode 431, a direct electrical current may be transmitted through the coating composition 440 via the electrodes (e.g., component 400, counter electrode 431). Parameters that affect the EPD process may be controlled to achieve the desired qualities for the composite coating. These parameters may include, for example, applied voltage, coating temperature, coating time, coating or deposition rate, etc. These parameters may affect the deposition kinetics to change the quality or characteristics of the composite coating (e.g., thickness, morphology, uniformity, surface coverage, etc.).

As noted earlier, the method 2000 includes, at block 2001, disposing inner particle coatings 420 to form a busbar pre-stack 450, followed by, at block 2002, disposing an outer particle coating 430. In such instances, the method 2000 may include sequentially submerging the component 400 in the coating composition 440 and performing EPD process operations to form the particle coatings 420, 430. Furthermore, any suitable number of coatings may be applied to the component conductive elements 310 to form the busbar pre-stack 450.

After deposition of the particle coatings 420, 430 on the component 400, the coated component may be post-processed. Post-processing the coated component may include rinsing the component 400 to remove excess coating composition 440 from the component 400. In certain embodiments, if one or more masks (e.g., masking tape) were applied to the coated components, the masks may be removed and/or reapplied after each EPD process operation.

As mentioned earlier, after the EPD process, and any post-processing operations, the component 400 includes a coating of particles deposited on surfaces of the component. In some embodiments, the particle coatings 420, 430 may include an interconnected network of ceramic particles. The particle coatings 420, 430 may further include voids or gaps between the ceramic particles, and these voids or gaps may be at least partially filled by impregnating a polymeric material (e.g., such as a material similar to polymeric material 142) in these voids or gaps to form the inner insulating coatings 320 and the outer insulation coating 330.

As noted earlier, the dielectric constant of the insulation coatings 320 and 330 may be varied through varying one or more of the type of particles in the insulation coating, the amount of particles in the insulation coating, or the distribution of the particles in the insulation coating. For example, in some embodiments, the dielectric constant of the insulation coatings 320, 330 may be varied by varying the type of particles (i.e., by employing particles with different dielectric constants) used in the electrophoretic process operations of blocks 2002, 2003. Similarly, in some other embodiments, the dielectric constant of the insulation coatings 320, 330 may vary in response to varying the amount of the particles in the coating composition 440 during the electrophoretic process operations of blocks 2002, 2003. In some embodiments a combination of one or more of the type of particles in the coating composition 440, the amount of particles in the coating composition 440, or the distribution of the particles in the coating composition 440 may vary the dielectric constants in the insulation coatings 320, 330.

In some embodiments, the deposited particles may be subjected to one or more heat treatment operations before contacting the particle coatings 420, 430 with the polymeric material. By heat-treating the deposited particles, partial or complete sintering of the particles may be achieved. Partial or complete sintering of the particles may improve mechanical integrity of the deposited particle coatings 420, 430 during subsequent contacting impregnation operations. Furthermore, partial or completely sintered particles may improve thermal conductivity of the insulation coatings 320, 330.

Referring back to FIGS. 8-10, the method 2000 further includes, at block 2003, contacting the particle coatings 420, 430 deposited by the EPD process with a polymeric material. The particle coatings 420, 430 may be contacted with the polymeric material using any suitable technique, such as, for example an immersion process or a vacuum pressure impregnating process. The technique (as well as conditions) used for the contacting operations may depend, at least in part, on the characteristics of the polymeric material. For example, for a low viscosity polymeric material (e.g., epoxy, silicone), an immersion process and/or a vacuum pressure impregnation process may be used. However, for high-viscosity thermoplastic materials, high-pressure impregnation may be used, for example, by using an autoclave. The method further includes impregnating the polymeric material (e.g., a thermoset resin) into voids present in the particle coatings 420, 430 deposited by the EPD process on the surface of the component 400.

Subsequently, the method 2000 further includes, at block 2004, post-processing the impregnated coating to form the insulation coatings 320, 330. Post-processing of the impregnated coating may include melting or curing the polymeric material. Post-processing may include subjecting the impregnated coating to any suitable treatment such that one or more of partial curing of the polymeric material, complete curing of the polymeric material, partial melting of the polymeric material, and complete melting of the polymeric material is achieved. The melting or curing of the polymeric material in the second coating may be achieved using any suitable treatment, such as treatments that include use of heat, ultraviolet (UV) light, infrared (IR) light, plasma and/or electron beam energy.

In certain embodiments, the method 2000 includes curing the thermoset resin to form the insulation coatings 320, 330. In some embodiments, the curing process may use any suitable treatment, such as treatments that include use of heat, ultraviolet (UV) light, infrared (IR) light, and/or electron beam energy to crosslink the deposited thermoset resin. The heat treatment or curing process may substantially reduce or eliminate the gaps, voids, and/or factures in the as-deposited impregnated coating to form a continuous, conformal coating on the component 400, in some embodiments.

Technical effects of the present disclosure include improving insulation systems to enable higher power density medium voltage converters. Using a combination of the systems and methods described herein may enable design of a medium voltage converter that has insulation resistant to both partial discharge and surface discharge and that has a capacitive grading capability (e.g. varied dielectric constant) to smooth out the high frequency electric field. These design features may enable the medium voltage converter to have higher dielectric constant to improve capacitive coupling and/or have higher thermal conductivity (e.g., predicted 5 times relatively larger to current insulations) to enable better heat rejection. Furthermore, an EPD process for deposition of the insulation systems may further improve insulation system technology by permitting deposition of a conformal coating independent of a complexity of conductor geometry, such as to produce a semiconductor device (e.g., SiC device), a laminated busbar, and/or transformer (e.g., high frequency transformers). Additionally or alternative, the EPD process enables application of variable coatings thickness and/or multilayer structures. The individual layer applications of the EPD process (e.g., inner/outer coatings) enable each layer to have same or different properties, tunable dielectric constant, and tunable thermal conductivities via selection of particles and ceramic materials used in the EPD process. Individually selectable layer properties may improve insulation technologies since depositing coatings with sequentially arranged dielectric constants may create an electric stress grading to overcome an electric field (e.g., high electric field) generated by fast switching of a switching device that includes the graded insulation. Furthermore, a selection of the polymeric material may improve dielectric strength of insulation to improve resistance to high temperatures (e.g., high operating temperatures, high ambient temperatures).

This written description uses examples to disclose the embodiments, including the best mode, and also to enable any person skilled in the art to practice the embodiments, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

The invention claimed is:

1. A semiconductor package, comprising:
   a semiconductor device disposed on a substrate;
   a conductive component interposed between the semiconductor device and the substrate; and
   an insulation system at least partially encapsulating the semiconductor device, the conductive component and the substrate, wherein the insulation system is characterized by a dielectric constant that decreases in a direction away from the substrate, and wherein the insulation system comprises at least one composite coating comprising a plurality of particles dispersed in a polymer matrix.

2. The semiconductor package of claim 1, wherein the insulation system comprises a plurality of composite coatings, wherein each composite coating of the plurality of composite coatings comprises a respective polymer matrix and a respective plurality of particles dispersed in the respective polymer matrix, and wherein each composite coating of the plurality of composite coatings is characterized by a dielectric constant that is different from each other.

3. The semiconductor package of claim 2, wherein the dielectric constant of the plurality of composite coatings is varied by varying types of particles of the respective plurality of particles in the composite coating, an amount of particles of the respective plurality of particles in the composite coating, or a distribution of particles of the respective plurality of particles in the composite coating.

4. The semiconductor package of claim 2, wherein the dielectric constant of the plurality of composite coatings is varied by using a non-linear dielectric particle.

5. The semiconductor package of claim 2, wherein the insulation system comprises:

a first composite coating disposed adjacent to the semiconductor device, the conductive component, and the substrate, wherein the first composite coating has a first dielectric constant; and
   a second composite coating disposed adjacent to the semiconductor device, the first composite coating and the substrate, wherein the second composite coating has a second dielectric constant, wherein the first dielectric constant is greater than the second dielectric constant.

6. The semiconductor package of claim 5, wherein the first dielectric constant is a relative dielectric constant configured in a range of about 20 to about 200, and wherein the second dielectric constant is a relative dielectric constant configured in a range of about 5 to about 20.

7. The semiconductor package of claim 1, wherein the polymer matrix comprises a thermoset resin selected from epoxy, siloxane, polyester, polyurethane, cyanate ester, polyimide, polyamide, polyamideimide, polyesterimide, polyvinyl ester, or any combination thereof.

8. The semiconductor package of claim 1, wherein the plurality of particles is selected from boron nitride particles, aluminum nitride particles, alumina particles, silicone oxide particles, aluminum silicate particles, mica particles, titanium oxide particles, barium titanium oxide particles, strontium titanium oxide particles, or any combination.

9. The semiconductor package of claim 1, wherein the semiconductor device is a silicon carbide (SiC) device.

10. A method of packaging a semiconductor package comprising a semiconductor device disposed on a substrate and a conductive component interposed between the semiconductor device and the substrate, the method comprising:
    disposing an insulation system on at least a portion of a surface of the semiconductor device, the conductive component, and the substrate, via an electrophoretic process, wherein the insulation system is characterized by a dielectric constant that decreases in a direction away from the substrate, and wherein the insulation system comprises at least one composite coating comprising a plurality of particles dispersed in a polymeric matrix.

11. The method of claim 10, wherein disposing the insulation system comprises disposing a plurality of composite coatings, via an electrophoretic process, wherein each composite coating of the plurality of composite coatings comprises the polymer matrix and the plurality of particles dispersed in the polymer matrix, and wherein each composite coating of the plurality of composite coatings is characterized by a dielectric constant that is different from each other.

12. The method of claim 11, wherein the dielectric constant of the plurality of composite coatings is varied by varying a type of particles of the plurality of particles in the composite coating, an amount of particles of the plurality of particles in the composite coating, or a distribution of particles of the plurality of particles in the composite coating.

13. The method of claim 12, wherein the plurality of composite coatings comprises a first composite coating having a first dielectric constant, a second composite coating having a second dielectric constant, and a third composite coating having a third dielectric constant, wherein the first dielectric constant is a relative dielectric constant configured in a range of about 20 to about 200, wherein the second dielectric constant is a relative dielectric constant configured in a range of about 5 to about 20, and wherein the third dielectric constant is a relative dielectric constant configured in a range of about 2 to about 5.

14. The method of claim 11, wherein the dielectric constant of the plurality of composite coatings is varied by using a non-linear dielectric particle.

15. The method of claim 10, wherein disposing the insulation system comprises:
   disposing a first particle coating comprising a first plurality of particles adjacent to the semiconductor device, the conductive component, and the substrate, via an electrophoretic process;
   disposing a second particle coating comprising a second plurality of particles adjacent to the semiconductor device, the first particle coating, and the substrate, via the electrophoretic process;
   disposing a third particle coating comprising a third plurality of particles adjacent to the second particle coating and the substrate, via the electrophoretic process;
   contacting the first particle coating, the second particle coating and the third particle coating with a polymeric material; and
   curing the polymeric material to form a first composite coating comprising the first plurality of particles dispersed in the polymer matrix, a second composite coating comprising the second plurality of particles dispersed in the polymer matrix, and a third composite coating comprising the third plurality of particles dispersed in the polymer matrix, and wherein a dielectric constant of the first composite coating is greater than a dielectric constant of the second composite coating, and the dielectric constant of the second composite coating is greater than a dielectric constant of the third composite coating.

16. The method of claim 10, wherein the semiconductor device is a silicon carbide (SiC) device.

17. A busbar laminate, comprising:
   a plurality of conductive elements;
   a plurality of inner insulation coatings interspersed between the plurality of conductive elements to form a busbar stack; and
   an outer insulation coating at least partially encapsulating the busbar stack, wherein the outer insulation coating is characterized by a dielectric constant that is lower than the dielectric constant of the plurality of inner insulation coatings, and wherein the plurality of inner insulation coatings and the outer insulation coating comprise at least one composite coating comprising a plurality of particles dispersed in a polymer matrix.

18. The busbar laminate of claim 17, wherein each coating of the plurality of inner insulation coatings comprises a first plurality of particles dispersed in the polymer matrix, and wherein the outer insulation coating comprises a second plurality of particles dispersed in the polymer matrix.

19. The busbar laminate of claim 18, wherein the first plurality of particles is selected from titanium oxide particles, barium titanium oxide particles, strontium titanium oxide particles, or any combination thereof.

20. The busbar laminate of claim 18, wherein the second plurality of particles is selected from boron nitride particles, aluminum nitride particles, alumina particles, or any combination thereof.

21. The busbar laminate of claim 18, wherein the polymer matrix comprises a thermoset resin selected from epoxy, siloxane, polyester, polyurethane, cyanate ester, polyimide, polyamide, polyamideimide, polyesterimide, polyvinyl ester, or any combination thereof.

22. The busbar laminate of claim 17, wherein the dielectric constant of the inner insulation coatings is a relative dielectric constant configured in a range from about 5 to about 100, and the dielectric constant of the outer insulation coating is a relative dielectric constant configured in a range from about 2 to about 5.

23. A method of forming a busbar laminate, comprising:
   disposing a plurality of inner insulation coatings between a plurality of conductive elements to form a busbar stack; and
   at least partially encapsulating the busbar stack with an outer insulation coating, wherein the outer insulation coating is characterized by a dielectric constant that is lower than the dielectric constant of the plurality of inner insulation coatings, and wherein the plurality of inner insulation coatings and the outer insulation coating comprise at least one composite coating comprising a plurality of particles dispersed in a polymer matrix.

24. The method of claim 23, comprising:
   coating the plurality of conductive elements with a plurality of inner particle coatings comprising a first plurality of particles, via an electrophoretic process, to form a busbar pre-stack;
   at least partially encapsulating the busbar pre-stack with an outer particle coating comprising a second plurality of particles, via the electrophoretic process;
   contacting the plurality of inner particle coatings and the outer particle coating with a polymeric material; and
   curing the polymeric material to form the plurality of inner insulation coatings comprising the first plurality of particles dispersed in the polymer matrix, and the outer insulation coating comprising the second plurality of particles dispersed in the polymer matrix.

25. The method of claim 23, wherein the dielectric constant of the inner insulation coatings is a relative dielectric constant configured in a range from about 5 to about 100, and the dielectric constant of the outer insulation coating is a relative dielectric constant configured in a range from about 2 to about 5.

* * * * *